(12) United States Patent
Jung et al.

(10) Patent No.: US 9,196,849 B2
(45) Date of Patent: Nov. 24, 2015

(54) POLYMER/INORGANIC MULTI-LAYER ENCAPSULATION FILM

(71) Applicant: RESEARCH & BUSINESS FOUNDATION SUNGKYUNKWAN UNIVERSITY, Suwon-si (KR)

(72) Inventors: Dong Geun Jung, Seoul (KR); Heeyeop Chae, Seoul (KR); Min Woo Park, Seoul (KR); Hoon Bae Kim, Incheon (KR); Chae Min Lee, Gwacheon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 23 days.

(21) Appl. No.: 14/149,852

(22) Filed: Jan. 8, 2014

(65) Prior Publication Data
US 2014/0190565 A1      Jul. 10, 2014

(30) Foreign Application Priority Data

Jan. 9, 2013 (KR) .................. 10-2013-0002648
Oct. 15, 2013 (KR) .................. 10-2013-0122884

(51) Int. Cl.
*H01L 51/10*     (2006.01)
*H01L 51/44*     (2006.01)
*H01L 51/52*     (2006.01)

(52) U.S. Cl.
CPC ............ *H01L 51/107* (2013.01); *H01L 51/448* (2013.01); *H01L 51/5253* (2013.01); *Y02E 10/549* (2013.01); *Y10T 428/269* (2015.01); *Y10T 428/31507* (2015.04); *Y10T 428/31663* (2015.04)

(58) Field of Classification Search
None
See application file for complete search history.

(56) References Cited

U.S. PATENT DOCUMENTS

| | | | |
|---|---|---|---|
| 5,434,008 A * | 7/1995 | Felts | 428/461 |
| 5,686,360 A * | 11/1997 | Harvey et al. | 438/28 |
| 6,169,127 B1 * | 1/2001 | Lohmann et al. | 523/106 |
| 6,312,793 B1 * | 11/2001 | Grill et al. | 428/312.6 |
| 6,465,953 B1 * | 10/2002 | Duggal | 313/553 |
| 7,704,894 B1 * | 4/2010 | Henri et al. | 438/778 |
| 8,017,527 B1 * | 9/2011 | Dhas et al. | 438/778 |
| 2005/0119394 A1 * | 6/2005 | Sakurai et al. | 524/492 |
| 2005/0276930 A1 * | 12/2005 | Gates et al. | 427/551 |
| 2006/0052566 A1 * | 3/2006 | Sakurai et al. | 528/12 |

(Continued)

FOREIGN PATENT DOCUMENTS

| | | |
|---|---|---|
| KR | 10-2011-0007166 A | 1/2011 |
| KR | 10-2011-0062382 A | 6/2011 |

(Continued)

OTHER PUBLICATIONS

Hnilica et al. "PECVD of nanostructured SiO2 in a modulated microwave plasma jet at atmospheric pressure" J. Phys. D: Appl. Phys. 46, 2013, 335202, 8 pages.*

(Continued)

*Primary Examiner* — Robert S Loewe
(74) *Attorney, Agent, or Firm* — NSIP Law

(57) ABSTRACT

This invention relates to a polymer/inorganic multi-layer encapsulation film, and more particularly, to a multi-layer encapsulation film, which includes a plasma polymer thin film layer formed using a cross-shaped precursor having Si—O bonding and an inorganic thin film layer, and ensures flexibility and has improved encapsulation.

14 Claims, 7 Drawing Sheets

(56) References Cited

U.S. PATENT DOCUMENTS

| | | | | |
|---|---|---|---|---|
| 2008/0260956 A1* | 10/2008 | Sakurai et al. | ................ | 427/387 |
| 2010/0089636 A1* | 4/2010 | Ramadas et al. | ............... | 174/521 |
| 2011/0132449 A1* | 6/2011 | Ramadas et al. | ............... | 136/256 |
| 2011/0198627 A1 | 8/2011 | Maindron et al. | | |

FOREIGN PATENT DOCUMENTS

| | | | |
|---|---|---|---|
| KR | 10-2011-0081215 A | 7/2011 | |
| KR | 10-2012-0090380 A | 8/2012 | |
| KR | 10-2012-0138307 A | 12/2012 | |
| KR | 10-1255232 B1 | 4/2013 | |
| WO | WO 2009/126115 A1 | 10/2009 | |

OTHER PUBLICATIONS

Korean Office Action issued Apr. 11, 2014 in counterpart Korean Patent Application No. 10-2013-0122884 (4 pages, in Korean).

Miller, David C., et al. "Thermomechanical properties of aluminum alkoxide (alucone) films created using molecular layer deposition." *Acta Materialia* 57 (2009): pp. 5083-5092.

Oh Hyojin, Sungkyunkwan University, Republic of Korea, Dissertation, Characteristics of low dielectric constant plasma polymer film with Tetrakis (trimethylsilyloxy) silane and Cyclohexane by using Plasma enhanced Chemical Vapor Deposition, 54 pages (Feb. 2013).

\* cited by examiner

POLYMER/INORGANIC MULTI-LAYER ENCAPSULATION FILM

CROSS-REFERENCE TO RELATED APPLICATIONS

This application claims the benefit of Korean Patent Application No. 10-2013-0002648, filed on Jan. 9, 2013 and Korean Patent Application No. 10-2013-0122884, filed on Oct. 15, 2013, in the Korean Intellectual Property Office, the entire disclosures of which are incorporated herein by reference for all purposes.

TECHNICAL FIELD

The present invention relates to a polymer/inorganic multi-layer encapsulation film, which ensures flexibility and has improved encapsulation properties.

BACKGROUND ART

Techniques of producing organic electronic devices using organic materials enable the integration of displays, circuits, cells, sensors, etc. on flexible plastic substrates at low temperatures, approximately equivalent to room temperature, by the use of coating and printing processes. These techniques are advantageous because electronic devices may be inexpensively formed on large flexible substrates.

However, organic electronic devices are vulnerable to the permeation of moisture or oxygen. In particular, many kinds of polymer substrates, due to their high moisture and oxygen permeability, are difficult for use in OLED flexible displays. Thus, in order to manufacture organic electronic devices having a long lifespan, encapsulation techniques for blocking the permeation of moisture and oxygen are required. Although the upper surface of organic electronic devices was initially encapsulated with glass or a metal lid, moisture could still permeate through the sealant between the substrate and the encapsulation layer. Furthermore, because the encapsulation layer is inflexible, it is difficult to apply to flexible devices. To overcome the problems of the glass or metal lid, research into encapsulation techniques using inorganic thin films, organic thin films or organic/inorganic multi-layer thin films having a combination thereof is ongoing.

Regarding conventional techniques for organic photoelectric coatings, the coating method of a multi-layer encapsulation structure including an inorganic layer and a polymer layer using vacuum equipment is exemplified. This method allows an organic device to be protected from moisture and oxygen by using a multi-layer encapsulation structure including an inorganic layer and a polymer layer joined by means of heat and electromagnetic radiation. In addition, a method for manufacturing a flexible display apparatus involves a technique applying an organic device onto a plastic substrate. This technique involves the fabrication of a thin film transistor and an organic light emitting device by forming a barrier layer on the surface of the plastic substrate.

The conventional encapsulation technique enables the device to be insulated from moisture by incorporating an inorganic thin film layer composed mainly of $SiO_2$, $SiN_x$, $In_2O_3$, etc. using chemical vapor deposition. However, this technique is problematic because pinholes may be formed upon deposition of the inorganic thin film, and defects may be caused due to physical damage when applied to flexible devices, undesirably resulting in permeation of moisture and oxygen. Briefly, functionality of the encapsulation film is easily lost. In order to reduce defects in the encapsulation layer due to such bending, alternate means of stacking inorganic thin films and polymer thin films are currently being studied.

Meanwhile, in order to form a thin film while suppressing the formation of pinholes in the thin film, research into fabrication of an inorganic thin film comprised of $Al_2O_3$, $SiO_2$, $TiO_2$, etc. using atomic layer deposition based on a self-limiting reaction has been carried out. However, this method is difficult to apply to production processes because of a low deposition rate of about 0.1 nm per cycle.

DISCLOSURE

Technical Problem

In this background, the present inventors have ascertained that a multi-layer encapsulation film having a relatively smaller number of pinholes may be manufactured in a shorter period of time by forming a very thin (~25 nm) inorganic thin film layer using atomic layer deposition and rapidly depositing a comparatively thick plasma polymer thin film layer using plasma enhanced chemical vapor deposition, and furthermore, the plasma polymer thin film layer may be prepared from a cross-shaped material (e.g. tetrakis(trimethylsilyloxy) silane) having Si—O bonding as a precursor, thereby remarkably improving encapsulation properties compared to conventional organic/inorganic multi-layer encapsulation films. The present invention is based on such a finding.

Technical Solution

A first aspect of the present invention provides a multi-layer encapsulation film, including a plasma polymer thin film layer formed by using a precursor represented by Chemical Formula 1 below; and an inorganic thin film layer:

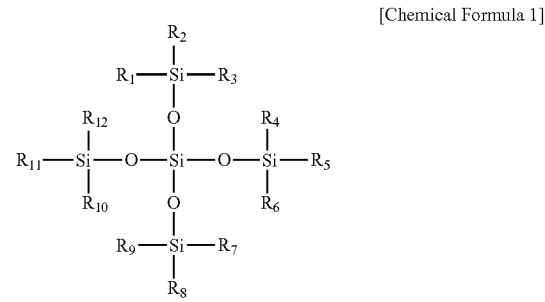

[Chemical Formula 1]

wherein $R_1$ to $R_{12}$ are each independently H or $C_1$-$C_5$ alkyl.

A second aspect of the present invention provides a method of manufacturing a multi-layer encapsulation film, including 1) depositing a plasma polymer thin film layer using a precursor represented by Chemical Formula 1; and 2) depositing an inorganic thin film layer using an inorganic precursor.

A third aspect of the present invention provides an organic electronic device, including a substrate and an organic electronic device layer formed thereon, wherein an organic layer(s) is encapsulated by the multi-layer encapsulation film according to the first aspect.

Hereinafter, a detailed description will be given of the present invention.

Inorganic material has low diffusivity D and low solubility S and thus exhibits superior properties as an encapsulation layer against moisture permeation. However, when an encapsulation layer composed exclusively of the inorganic material is applied to flexible devices, due to limitations of current deposition techniques (e.g. chemical vapor deposition, physical vapor deposition), moisture permeation potential may increase because of physical damage (e.g. cracking), undesirably reducing protection.

According to the present invention, a multi-layer encapsulation film is configured such that a plasma polymer thin film deposited using the precursor represented by Chemical Formula 1 having Si—O bonding with a cross-shaped molecular structure having vertical/horizontal bilateral symmetry in the chemical structure is stacked together with an inorganic thin film. The plasma polymer thin film is hydrophobic, flattens the surface, and lengthens the diffusion path, thereby decreasing moisture permeability to thereby impart outstanding encapsulation performance. Thus, the multi-layer encapsulation film according to the present invention may block permeation of external moisture and oxygen, and may thus prevent oxidation of a light emitting material, an electrode material, etc., and also may protect the organic electronic device from external mechanical and physical impacts.

Also, because the plasma polymer thin film deposited using the precursor represented by Chemical Formula 1 may improve encapsulation performance even when it is comparatively thin, it may achieve higher encapsulation performance when applied to organic electronic devices than conventional products, due to ensuring flexibility.

The multi-layer encapsulation film according to the present invention may be configured such that one or more dyads each including a pair of a single inorganic thin film layer and a single plasma polymer thin film layer are stacked. As such, the first layer stacked on the substrate, the number of stacking processes and the ultimately stacked layer are not particularly limited but may be appropriately selected by those skilled in the art. Also, the multi-layer encapsulation film according to the present invention may be configured such that a plasma polymer thin film layer is interposed between inorganic thin film layers (FIG. 3(e)).

With regard to the precursor represented by Chemical Formula 1, $R_1$ to $R_{12}$ in Chemical Formula 1 may be each independently H or $C_1$-$C_5$ alkyl, and examples of the alkyl may include methyl, ethyl, propyl and butyl. These alkyls may be linear or branched.

In an embodiment of the present invention, the precursor represented by Chemical Formula 1 may be tetrakis(trimethylsilyloxy)silane (TTMSS) wherein $R_1$ to $R_{12}$ are each methyl, as represented by Chemical Formula 2 below.

[Chemical Formula 2]

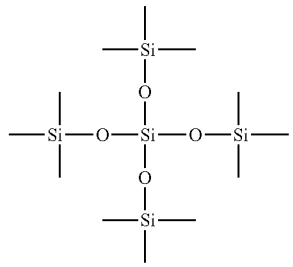

While the material represented by Chemical Formula 1 is carried around a substrate, it may be polymerized via interaction. Upon polymerization, —C—C— or —C—H— bonding may be formed in the material represented by Chemical Formula 1 or derivative thereof. Thereby, the plasma polymer thin film layer may contain the material represented by Chemical Formula 1 or derivative thereof as a polymerization unit.

In an embodiment of the present invention, the plasma polymer thin film layer may be formed from a precursor represented by Chemical Formula 1 using plasma enhanced chemical vapor deposition (PECVD). In particular, when using PECVD, electrons generated by plasma upon deposition may collide with precursor molecules of Chemical Formula 1, thus forming radical groups such as -$CH_3$., —$CH_2$., and —CH. in the molecule, which are then bound with each other, so that polymerization of the precursor or derivative thereof may easily take place. Thereby, while deposition and polymerization are carried out simultaneously, the plasma polymer thin film layer including the precursor unit or derivative unit thereof may be formed. When using PECVD, in order to minimize damage due to plasma, the plasma polymer thin film layer may be deposited using a power of 10 W or less. Accordingly, because the plasma polymer thin film formed by plasma may have a compact structure with little or no need for curing, the period of time required to form the polymer may be shortened compared to that required for the conventional chemical polymer, and furthermore, polymer properties may be improved.

In the present invention, the plasma polymer thin film layer may have a thickness of 10-200 nm. This thickness corresponds to one plasma polymer thin film layer. In the case where there are one or more plasma polymer thin film layers, they independently may have a thickness in the above range. If the thickness thereof is less than 10 nm, the effect of preventing permeation of oxygen and moisture may deteriorate. In contrast, if the thickness thereof exceeds 200 nm, the time required to form a desired film by the process may be prolonged, and flexibility may decrease.

In the present invention, the inorganic thin film layer may be formed using atomic layer deposition. The atomic layer deposition is implemented at a low temperature (130° C. or less) which is applicable to organic devices. The atomic layer deposition is based on a self-limiting reaction, thus suppressing the formation of pinholes in the thin film and facilitating the formation of a thin film.

In the present invention, the inorganic thin film layer may be composed of $Al_2O_3$, $SiO_2$, $TiO_2$, ZnO or combinations thereof. The inorganic thin film layer composed of $Al_2O_3$, $SiO_2$, ZnO or combinations thereof may be deposited by respectively using a precursor of $Al_2O_3$, a precursor of $SiO_2$, a precursor of $TiO_2$ or a precursor of ZnO. An example of the precursor of $Al_2O_3$ may include trimethyl aluminum, an example of the precursor of $SiO_2$ may include tetraethoxysilane, examples of the precursor of $TiO_2$ may include $TiCl_4$ and $[Ti(OEt)_4]$, and an example of the precursor of ZnO may include dietyl zinc, but these precursors are not limited thereto.

The inorganic thin film layer which can be located at the lowermost position of the multi-layer encapsulation film may be provided directly on the organic electronic device or the substrate, thereby preventing damage to the device and the substrate from occurring upon formation of the plasma polymer thin film.

Moreover, as the inorganic thin film layer is located at the uppermost position of the multi-layer encapsulation film, it may mechanically function as an encapsulation layer. Specifically, it may be provided at the outermost positions of the encapsulation film, thus effectively protecting the device from permeation of oxygen and moisture and from external mechanical and physical damage.

In the present invention, the inorganic thin film layer may have a thickness of 1-50 nm. This thickness corresponds to one inorganic thin film layer. In the case where there are one or more inorganic thin film layers, they independently may have a thickness in the above range. If the thickness thereof is less than 1 nm, the effect of preventing permeation of oxygen and moisture may diminish, and it is difficult to effectively protect the device from external damage. In contrast, if the thickness thereof exceeds 50 nm, the time required to form a desired film by the process may be prolonged, and the film may crack.

In the multi-layer encapsulation film according to an embodiment of the present invention, an $Al_2O_3$ inorganic thin film layer is formed using atomic layer deposition to reduce production of pinholes, and a plasma polymer thin film layer is formed from hydrophobic tetrakis(trimethylsilyloxy)silane using PECVD.

In the present invention, the multi-layer encapsulation film may be stacked on a flexible polymer substrate. For example, the multi-layer encapsulation film according to the present invention may be deposited on any one flexible polymer substrate selected from the group consisting of polyethylene terephthalate (PET), polyethylene naphthalate (PEN), polyethylene (PE), polyethersulfone (PES), polycarbonate (PC), polyarylate (PAR) and polyimide (PI), and thereby may be stacked on the flexible polymer substrate. The multi-layer encapsulation film stacked on the flexible polymer substrate may be adhered onto an organic electronic device using an adhesive such as epoxy, thereby encapsulating the device (FIG. 8b).

Meanwhile, in the present invention, the multi-layer encapsulation film may be directly deposited on the organic electronic device, which is specified in a third aspect as described in a subsequent section.

According to a second aspect of the present invention, a method of manufacturing the multi-layer encapsulation film includes 1) depositing a plasma polymer thin film layer using a precursor represented by Chemical Formula 1 below; and 2) depositing an inorganic thin film layer using an inorganic precursor:

[Chemical Formula 1]

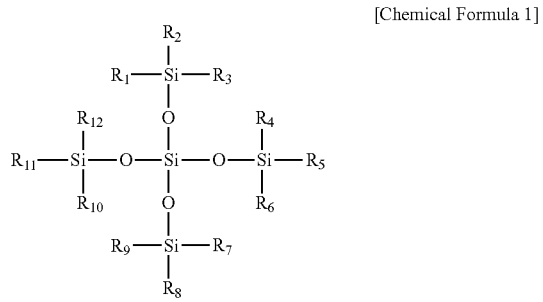

wherein $R_1$ to $R_{12}$ are each independently H or $C_1$-$C_5$ alkyl.

The method of manufacturing the multi-layer encapsulation film is as described in the first aspect.

As steps 1) and 2) are sequentially performed, a multi-layer encapsulation film wherein the plasma polymer thin film layer and the inorganic thin film layer are sequentially stacked may be produced. However, depending on the configuration of a desired encapsulation film, step 2) may be implemented before step 1), and steps 1) and 2) may be repeated, and also, deposition may be finally terminated at step 1).

Preferably, step 1) may be performed using PECVD, and step 2) may be performed using atomic layer deposition.

According to a third aspect of the present invention, an organic electronic device includes a substrate and an organic electronic device layer formed thereon, wherein an organic layer(s) is encapsulated by the multi-layer encapsulation film according to the first aspect.

In an embodiment of the present invention, the use of TTMSS polymer is confirmed to remarkably improve not only the properties of the bendable polymer layer but also of encapsulation properties when stacking the polymer layer together with an inorganic layer. Thereby, the encapsulation film having the inorganic layer and the polymer layer which are stacked, according to the present invention, may be applied to a variety of products including a flexible organic electronic device, especially an organic light emitting diode, an organic solar cell or an organic thin film transistor and thus may block permeation of oxygen and moisture.

According to the present invention, the multi-layer encapsulation film may be directly deposited on the substrate or the organic electronic device. The specific schematic view thereof is illustrated in FIG. 8(a). Also, the multi-layer encapsulation film according to the present invention is stacked on a flexible polymer substrate, and may be adhered on an organic electronic device using an adhesive such as epoxy. The specific schematic view thereof is illustrated in FIG. 8(b).

According to the present invention, the multi-layer encapsulation film may be provided on the top of the organic electronic device formed on the substrate and may thus encapsulate the device. Furthermore, it may be formed on the lateral surfaces or the bottom of the substrate, as well as the top of the device.

The organic electronic device layer may include a transparent conductive oxide, an organic layer and a metal electrode.

Specifically, the present invention may provide an organic light emitting diode including a substrate/a transparent conductive oxide/an organic layer/a metal electrode/the multi-layer encapsulation film; or a substrate/a metal electrode/an organic layer/a transparent conductive oxide/the multi-layer encapsulation film, which are sequentially stacked.

The substrate may be any one flexible polymer substrate selected from the group consisting of polyethylene terephthalate (PET), polyethylene naphthalate (PEN), polyethylene (PE), polyethersulfone (PES), polycarbonate (PC), polyarylate (PAR) and polyimide (PI), any one metal substrate selected from the group consisting of SUS (steel use stainless), aluminum, steel and copper, or a glass substrate.

The transparent conductive oxide (TCO) may include any one or mixtures thereof selected from the group consisting of indium tin oxide (ITO), indium zinc oxide (IZO), indium zinc tin oxide (IZTO), aluminum zinc oxide (AZO), indium tin oxide-silver-indium tin oxide (ITO-Ag-ITO), indium zinc oxide-silver-indium zinc oxide (IZO-Ag-IZO), indium zinc tin oxide-silver-indium zinc tin oxide (IZTO-Ag-IZTO) and aluminum zinc oxide-silver-aluminum zinc oxide (AZO-Ag-AZO).

The metal electrode may include any one or mixtures thereof selected from the group consisting of a stack of lithium fluoride and aluminum (LiF/Al), a stack of calcium and aluminum (Ca/Al), a stack of calcium and silver (Ca/Ag), aluminum (Al), silver (Ag), gold (Au) and copper (Cu).

The organic layer preferably includes a hole transport layer, a light emitting layer, an electron transport layer and/or an exciton blocking layer. Also, as the organic layer, any one or mixtures thereof selected from the group consisting of N,N'-di(naphthalen-1-yl)-N,N'-diphenyl-benzidine (NPB), copper phthalocyanine (CuPc), 4,4',4"-tris(2-naphthylphenylamino)triphenylamine (2-TNATA), 1,1-bis-(4-bis(4-tolyl)- aminophenyl)cyclohexene (TAPC), tris-8-hydroxyquinoline aluminum ($Alq_3$), spiro-TAD, TAZ, $Ir(ppz)_3$, bathophenanthroline (BPhen) and basocuproin (BCP) may be used.

In an embodiment of the present invention, an organic light emitting diode including a substrate/a transparent conductive oxide/an organic layer/a metal electrode/the multi-layer encapsulation film, which are sequentially stacked, is schematically illustrated in FIG. 9.

Also, the present invention may provide an organic solar cell, which includes a substrate/a transparent conductive oxide/an organic layer/a metal electrode/the multi-layer encapsulation film; or a substrate/a metal electrode/an organic layer/a transparent conductive oxide/the multi-layer encapsulation film, which are sequentially stacked.

The substrate, the transparent conductive oxide and the metal electrode are as described in the organic light emitting diode.

The organic layer preferably includes a p-type conductive layer, a light absorbing layer and an n-type conductive layer. Also, as the organic layer, any one or mixtures thereof selected from the group consisting of PEDOT:PSS (poly(3, 4,-ethylene dioxythiophene):polystyrene sulfonic acid), a polythiophene derivative, a polypyrrole derivative, a polyvinylcarbazole derivative, a polyaniline derivative, a polyacetylene derivative, a polyphenylenevinylene derivative and a fluorene derivative may be used.

Advantageous Effects

According to the present invention, a multi-layer encapsulation film is provided, which includes a plasma polymer thin film layer formed using a cross-shaped precursor having Si—O bonding, and an inorganic thin film layer, thereby effectively suppressing permeation of oxygen or moisture into an organic electronic device to thus prevent degradation of the device. In the multi-layer encapsulation film according to the present invention, because the plasma polymer thin film layer is very flexible, it achieves flexibility in the overall layer and is therefore suitable for being applied to an organic electronic device. Therefore, it is applicable to various substrates for use in flexible organic electronic devices in display industrial fields. Also in the encapsulation film, the plasma polymer thin film layer is positioned between inorganic thin film layers, thereby remarkably improving encapsulation properties and enhancing durability of bending.

MODE FOR INVENTION

A better understanding for constructions and effects of the present invention may be obtained through the following examples which are merely set forth to illustrate, but are not to be construed as limiting the present invention.

Example 1

Formation of Inorganic Thin Film Layer using Atomic Layer Deposition

Figure 1:
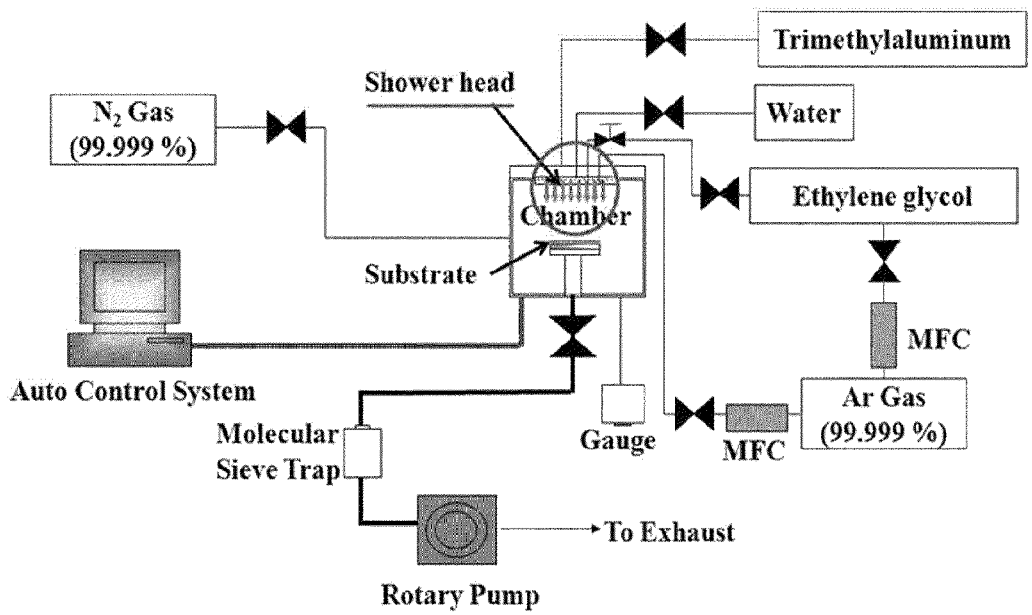
FIG. 1 schematically illustrates an atomic layer deposition apparatus used to manufacture an inorganic thin film.

An inorganic thin film layer was formed by performing atomic layer deposition using an apparatus illustrated in FIG. 1. As such, a vacuum chamber was maintained at 500 mTorr, and trimethyl aluminum and $H_2O$ were injected via a difference in pressure from the chamber, thus forming an $Al_2O_3$ inorganic thin film. In order to accomplish uniform deposition on the entire surface of polyethylene naphthalate (PEN) used as a plastic substrate, the temperature of the substrate was maintained at 85° C., and thus thermal energy suitable for a chemical reaction was supplied. Furthermore, the injection time of the inorganic material and the purging time of the remaining gas were adjusted, whereby the process conditions (TMA 1 sec—purge 15 sec—$H_2O$ 1 sec—purge 15 sec; 1 cycle) were determined. Through one cycle process, a thin film having a thickness of 0.12 nm was deposited, and 200 processes were repeated, thus manufacturing an inorganic thin film having a thickness of about 25 nm.

Example 2

Formation of Plasma polymer Thin Film Layer using PECVD

Figure 2:
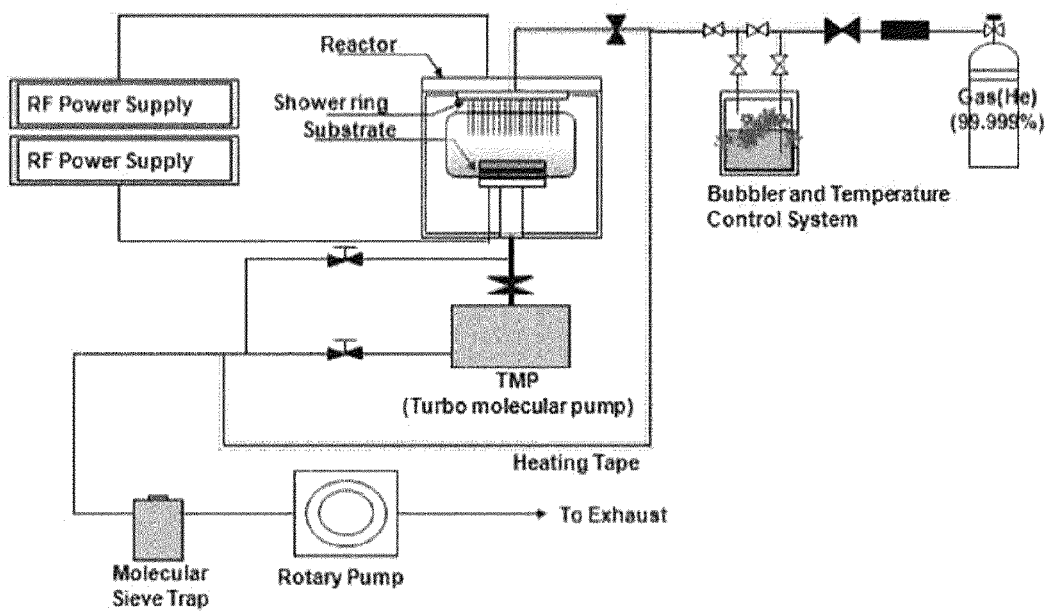
FIG. 2 schematically illustrates a plasma enhanced chemical vapor deposition (PECVD) apparatus used to manufacture a plasma polymer thin film.

A plasma polymer thin film layer was formed using a PECVD (Plasma Enhanced Chemical Vapor Deposition) apparatus illustrated in FIG. 2. A plasma polymer thin film deposition process was implemented by means of a process chamber having a chamber lid at the top thereof and a chamber body at the bottom thereof. Used as the precursor of the plasma polymer thin film was tetrakis(trimethylsilyloxy)silane (TTMSS). This precursor was used as a reactive gas, and the reactive gas was uniformly sprayed onto a substrate placed on a substrate susceptor in the chamber body by means of a shower ring provided at the chamber lid maintained at 200 mTorr, thus depositing a thin film. The temperature of 88° C. or higher was maintained so that TTMSS used as the reactive gas was emitted in a vapor state from a bubbler, and the temperature of the line was maintained at 99° C. in order to keep the vapor state even in the line connected up to the chamber, whereby the reactive gas was transferred into the chamber together with He gas as inert gas. TTMSS in a vapor state was deposited for 5 min using RF (radio frequency) plasma energy of 5 W supplied by the lower electrode on the substrate susceptor, thereby forming a TTMSS plasma polymer thin film having a thickness of about 80 nm.

Example 3

Measurement of Moisture and Oxygen Permeability of Multi-layer Encapsulation Film According to the Present Invention The multi-layer encapsulation film manufactured by the method of forming the inorganic thin film layer in Example 1 and the method of forming the plasma polymer thin film layer in Example 2 was measured for moisture and oxygen permeability using Ca-test.

Figure 3:
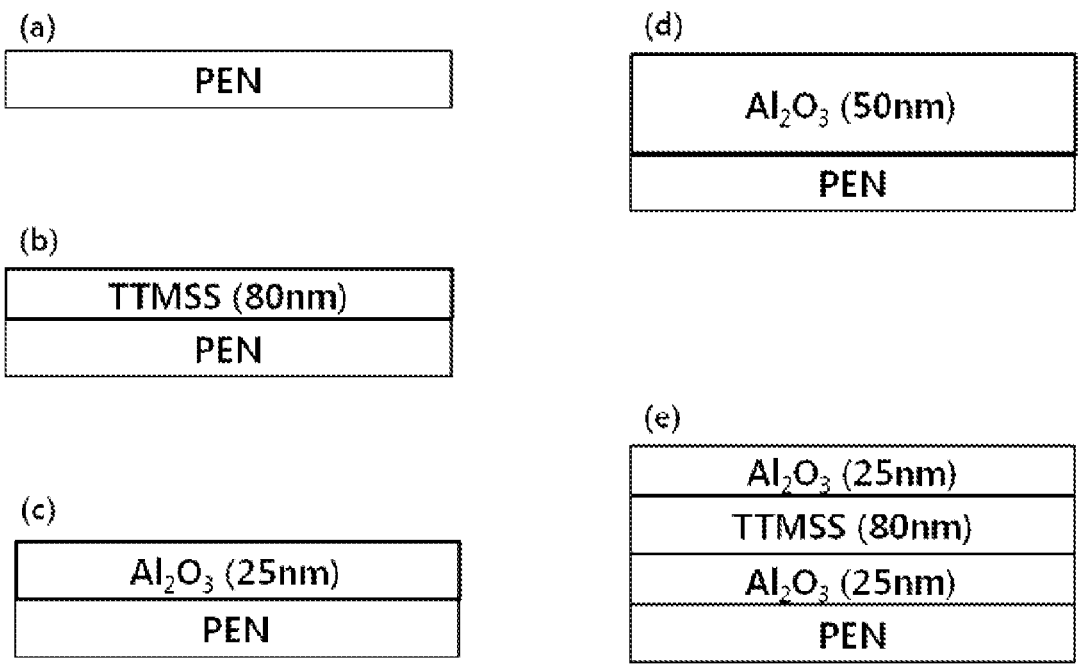
FIG. 3 schematically illustrates films used to measure moisture and oxygen permeability in Example 3.
Figure 4:
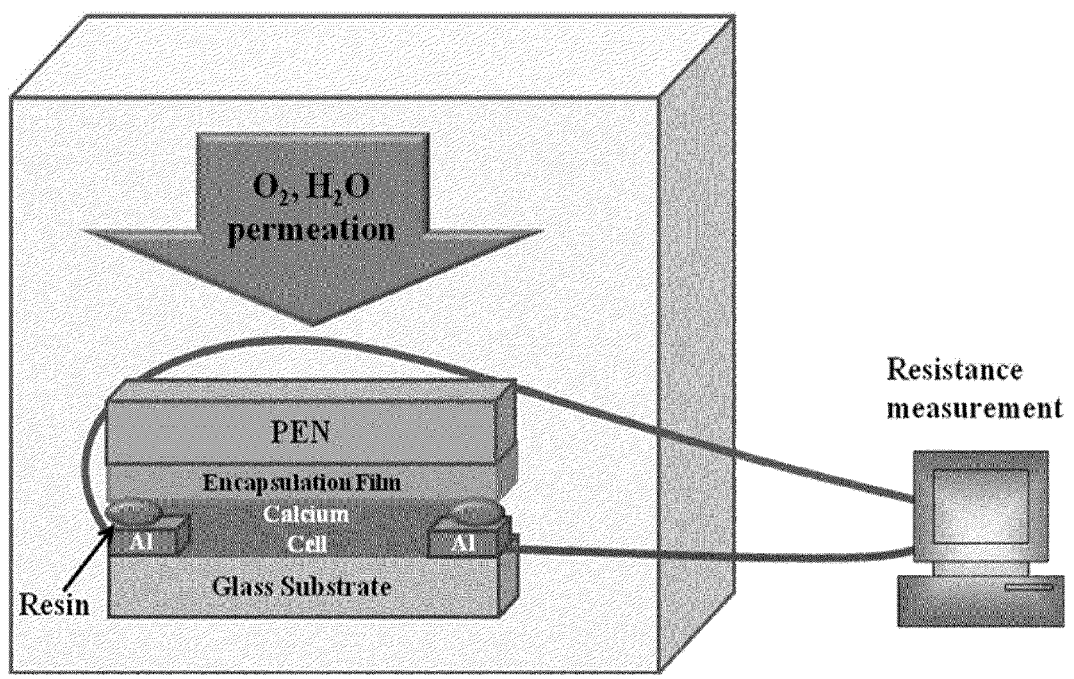
FIG. 4 schematically illustrates Ca-test equipment.

A variety of films are shown in FIG. 3. FIG. 3(b) illustrates a PEN substrate having a 80 nm thick TTMSS polymer layer deposited thereon, FIG. 3(c) illustrates a PEN substrate having a 25 nm thick $Al_2O_3$ layer deposited thereon, FIG. 3(d) illustrates a PEN substrate having a 50 nm thick $Al_2O_3$ layer deposited thereon, and FIG. 3(e) illustrates a PEN substrate having a 25 nm thick $Al_2O_3$ layer/a 80 nm thick TTMSS polymer layer/a 25 nm $Al_2O_3$ layer deposited thereon. The encapsulation properties of these substrates were compared and analyzed using Ca-test equipment illustrated in FIG. 4.

150 nm thick Al was deposited at both electrodes using thermal vapor deposition on a glass substrate and Ca having a thickness of about 300 nm was deposited in the pattern of 1.0 cm×1.5 cm therebetween. The glass substrate having the deposited electrodes and Ca, and the manufactured film were attached to each other using a resin and sealed via UV curing. These samples were maintained under conditions of 85° C. and a relative humidity of 85%, and while current was allowed to flow, resistance was measured. By oxygen and moisture permeated through the film-coated PEN substrate, Ca was caused to have non-conductive properties while being converted into CaO and $Ca(OH)_2$. The resistance of the samples is increased in proportion to an increase in the amount of converted Ca, and low resistance (high conductivity) retention time indicates the extent of encapsulation properties.

Figure 5:
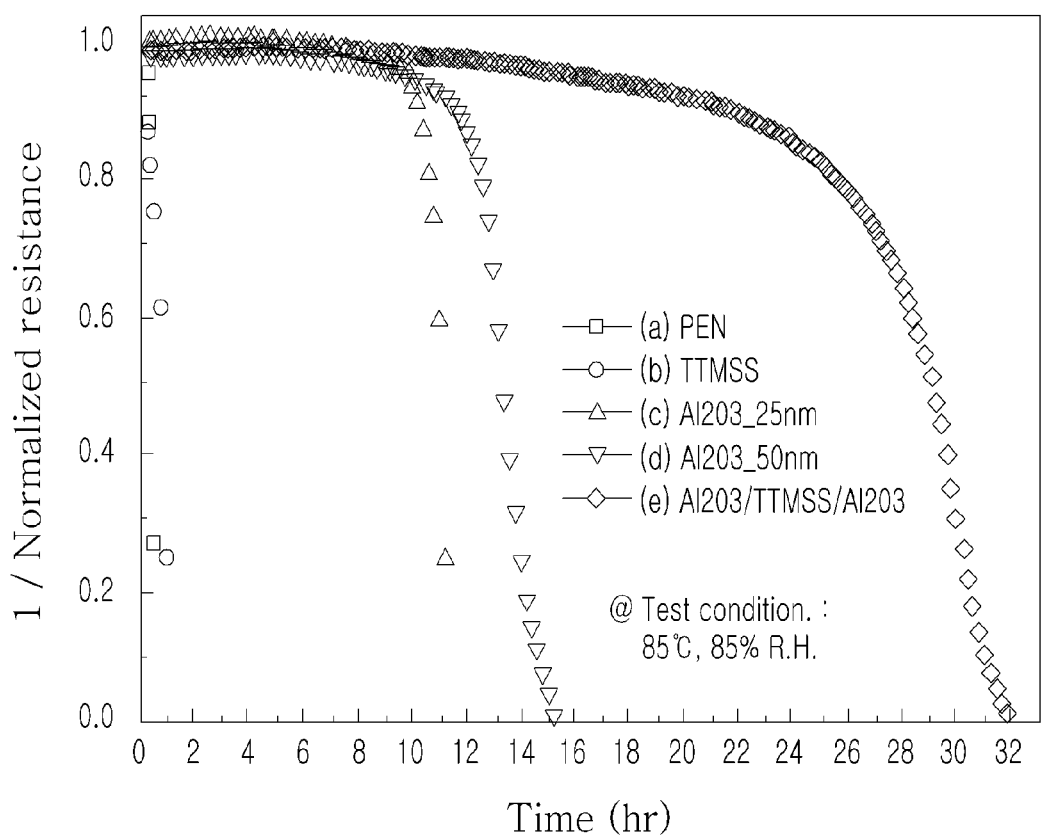
FIG. 5 is a graph illustrating the results of measurement of moisture and oxygen permeability in Example 3.

The results are shown in FIG. 5.

As illustrated in FIG. 5, when only the PEN substrate (a) was used as the encapsulation film, conductivity of Ca was drastically decreased. The PEN substrate having the TTMSS polymer deposited thereon (b) was slightly improved in performance, but the effect thereof was insignificant. When using the inorganic thin films, namely, $Al_2O_3$ 25 nm (c) and $Al_2O_3$ 50 nm (d), conductivity of Ca could be maintained for a longer period of time compared to the PEN substrate. However, when the thickness of the inorganic film was increased ($Al_2O_3$ nm→50 nm), the encapsulation properties were inefficiently and insignificantly increased. However, in the case of $Al_2O_3$ (25 nm)/TTMSS polymer (80 nm)/$Al_2O_3$ (25 nm) (e), although the use of the TTMSS plasma polymer thin film alone exhibited low encapsulation properties, when the polymer layer was stacked together with the inorganic thin film, the encapsulation properties could be remarkably improved. Furthermore, when compared with $Al_2O_3$ 50 nm without insertion of the plasma polymer thin film, the performance, namely, the encapsulation properties could be greatly improved via changes in the structure by the additional use of the TTMSS polymer compared to any possible improvement in performance due to only changes in the thickness of the inorganic layer.

Comparative Example 1

Measurement of Moisture and Oxygen Permeability of Alucone/$Al_2O_3$ Multi-layer Encapsulation Film An aluminum alkoxide (Alucone)/$Al_2O_3$ multi-layer encapsulation film was manufactured. The preparation of a polymer/inorganic multi-layer encapsulation film using Alucone was performed with reference to conventional paper (Steven M. George et.al, Thermomechanical properties of aluminum alkoxide (alucone) films created using molecular layer deposition, Acta Materialia 57 (2009) 5083-5092).

The $Al_2O_3$ inorganic thin film layer was first formed in the same manner as in Example 1.

The Alucone polymer thin film was formed using molecular layer deposition (MLD), and the precursors were trimethyl aluminum (TMA, $Al(CH_3)_3$) and ethylene glycol ($OHCH_2CH_2OH$). Specifically, TMA was first injected and then deposited on the substrate, and the remaining gas was purged. Subsequently, ethylene glycol was injected, and the remaining gas of the reaction was purged. This one cycle process was repeated, thus producing an Alucone polymer thin film having a thickness of about 50 nm.

Figure 6:
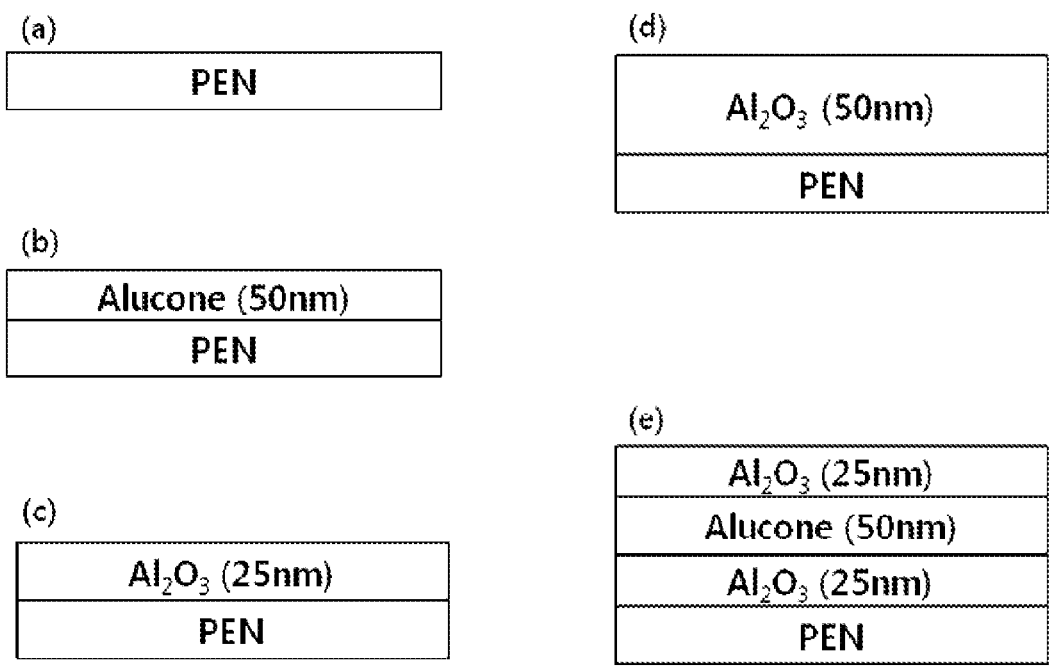
FIG. 6 schematically illustrates films used to measure moisture and oxygen permeability in Comparative Example 1.

A film in the same configuration as in Example 3 was manufactured using the methods of forming the inorganic thin film and the plasma polymer thin film as above. The schematic view thereof is illustrated in FIG. 6. Specifically, FIG. 6(b) illustrates a PEN substrate having a 50 nm thick Alucone polymer layer deposited thereon, FIG. 6(c) illustrates a PEN substrate having a 25 nm thick $Al_2O_3$ layer deposited thereon, FIG. 6(d) illustrates a PEN substrate having a 50 nm thick $Al_2O_3$ layer deposited thereon, and FIG. 6(e) illustrates a PEN substrate having a 25 nm thick $Al_2O_3$ layer/50 nm thick Alucone polymer layer/25 nm thick $Al_2O_3$ layer deposited thereon.

The encapsulation properties of these substrates were compared and analyzed using Ca-test equipment in the same manner as in Example 3.

Figure 7:
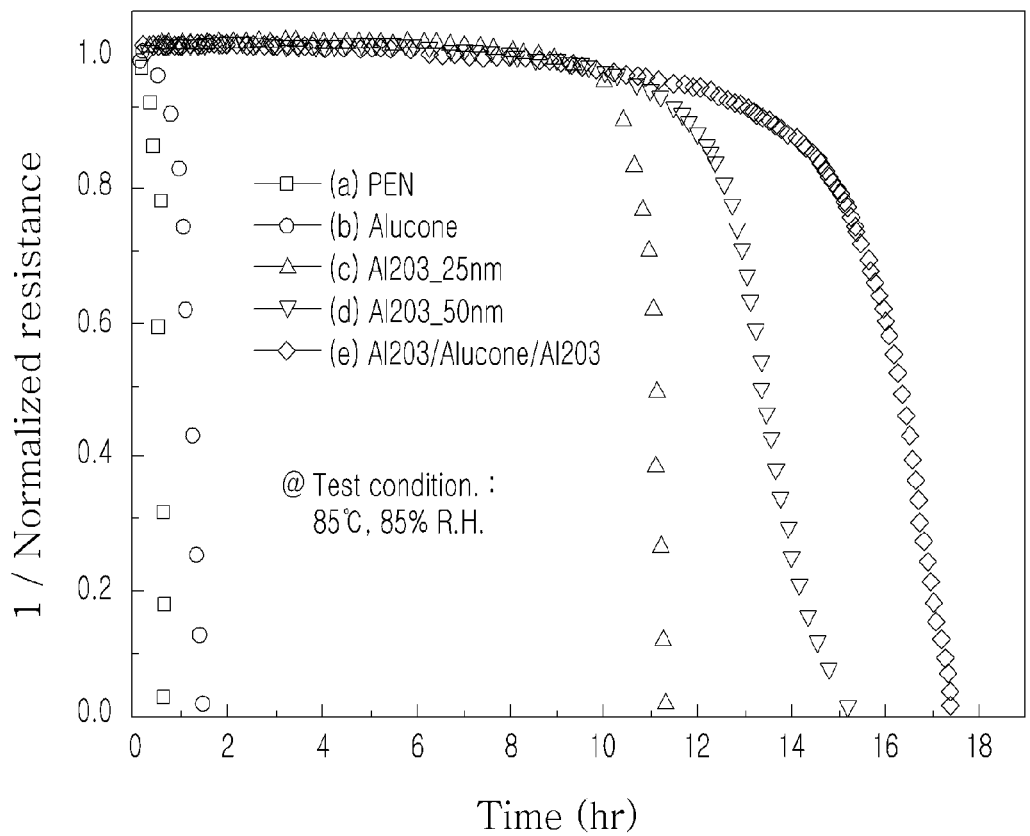
FIG. 7 is a graph illustrating the results of measurement of moisture and oxygen permeability in Comparative Example 1.
Figure 8A:
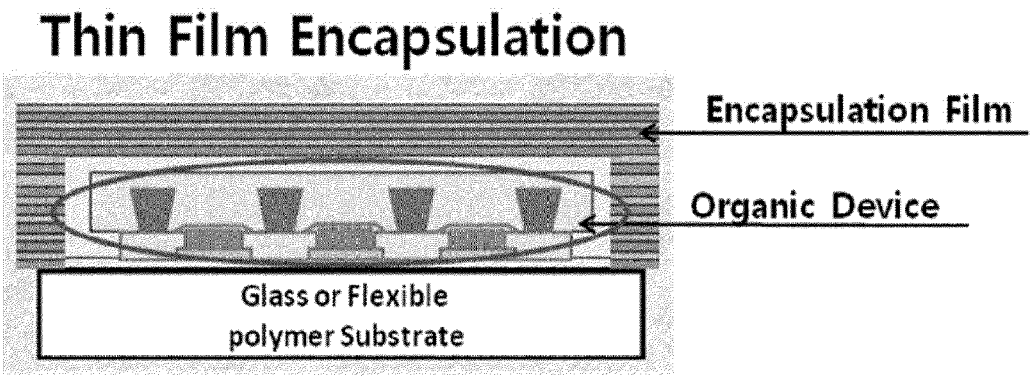
FIG. 8a schematically illustrates a multi-layer encapsulation film according to the present invention directly deposited on an organic electronic device.
Figure 8B:
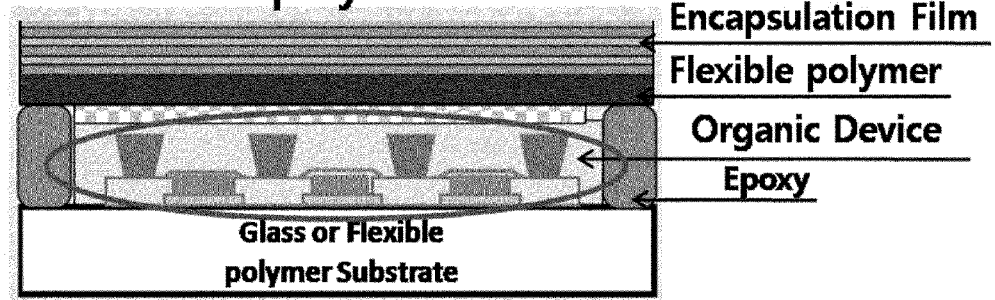
FIG. 8b is a schematic view illustrating a multi-layer encapsulation film according to the present invention adhered on an organic electronic device.
Figure 9:
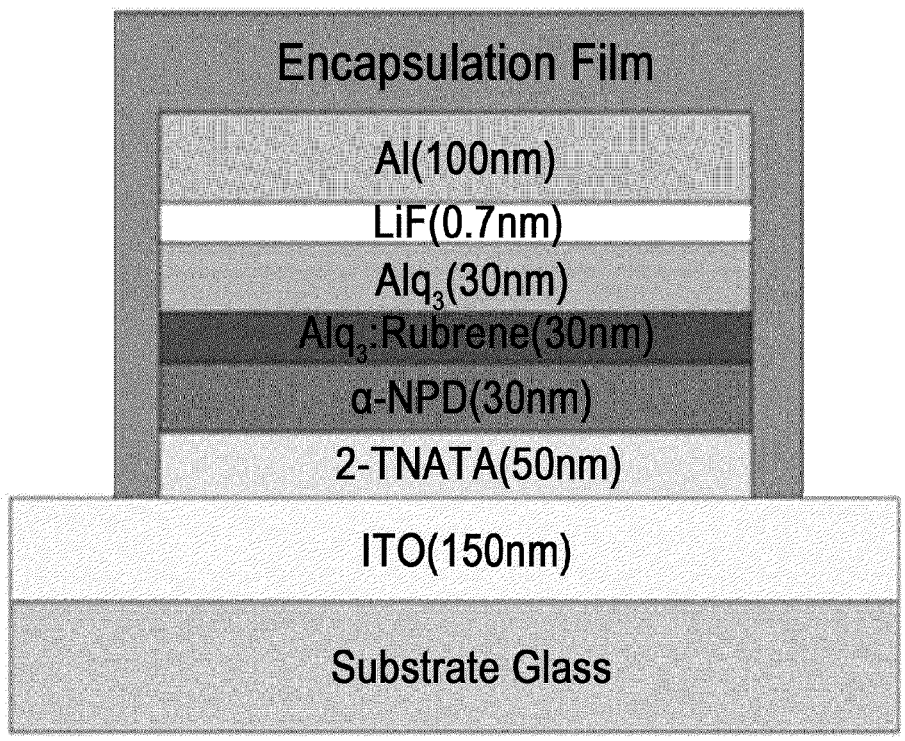
FIG. 9 schematically illustrates an organic light emitting diode according to an embodiment of the present invention.

The results are shown in FIG. 7.

In the case of $Al_2O_3$ (25 nm)/Alucone polymer (50 nm)/$Al_2O_3$ (25 nm) (e), the conductivity retention time of Ca was less than 18 hr. However, the multi-layer encapsulation film of Example 3 illustrated in FIG. 3(e) was maintained for 32 hr (FIG. 5(e)), and had drastically increased encapsulation properties.

Also when compared with $Al_2O_3$ 50 nm without insertion of the polymer thin film (d), the $Al_2O_3$ (25 nm)/Alucone polymer (50 nm)/$Al_2O_3$ (25 nm) merely increased the conductivity retention time by about 2 hr, and was considerably similar to improvement in performance resulting from changes only in the thickness of the inorganic layer.

When summarizing the above results, the encapsulation properties of the $Al_2O_3$ (25 nm)/TTMSS polymer (80 nm)/$Al_2O_3$ (25 nm) multi-layer film of Example 3 (FIG. 3(e) of Example 3), and the $Al_2O_3$ (25 nm)/Alucone polymer (50 nm)/$Al_2O_3$ (25 nm) multi-layer film of Comparative Example 1 (FIG. 6(e) of Comparative Example 1) are given in Table 1 below.

TABLE 1

| Moisture permeability | TTMSS/$Al_2O_3$ multi-layer encapsulation film | Alucone/$Al_2O_3$ multi-layer encapsulation film |
|---|---|---|
| WVTR (g/m² · day) | $7.1 \times 10^{-05}$ | $1.8 \times 10^{-03}$ |

The invention claimed is:

1. A multi-layer encapsulation film, comprising:
a plasma polymer thin film layer formed by using a precursor represented by Chemical Formula 1 below; and
an inorganic thin film layer:

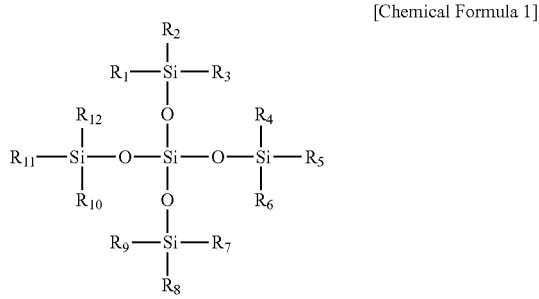

[Chemical Formula 1]

wherein $R_1$ to $R_{12}$ are each independently H or $C_1$-$C_5$ alkyl, and
wherein the plasma polymer thin film layer is stacked between inorganic thin film layers.

2. The multi-layer encapsulation film of claim 1, wherein the precursor is tetrakis(trimethylsilyloxy)silane.

3. The multi-layer encapsulation film of claim 1, wherein the inorganic thin film layer is stacked on either or both surfaces of the plasma polymer thin film layer.

4. The multi-layer encapsulation film of claim 1, wherein the plasma polymer thin film layer is formed by plasma enhanced chemical vapor deposition (PECVD).

5. The multi-layer encapsulation film of claim 1, wherein the inorganic thin film layer is formed by atomic layer deposition.

6. The multi-layer encapsulation film of claim 1, wherein the inorganic thin film layer comprises $Al_2O_3$, $SiO_2$, $TiO_2$, ZnO or combinations thereof.

7. The multi-layer encapsulation film of claim 1, wherein the plasma polymer thin film layer has a thickness of 10-200 nm.

8. The multi-layer encapsulation film of claim 1, wherein the inorganic thin film layer has a thickness of 1-50 nm.

9. The multi-layer encapsulation film of claim 1, wherein the multi-layer encapsulation film is stacked on a flexible polymer substrate.

10. A method of manufacturing a multi-layer encapsulation film of claim 1, comprising:
1) depositing a plasma polymer thin film layer using a precursor represented by Chemical Formula 1 below; and
2) depositing an inorganic thin film layer using an inorganic precursor of Chemical Formula 1; and
3) stacking the plasma polymer thin film layer between inorganic thin film layers:

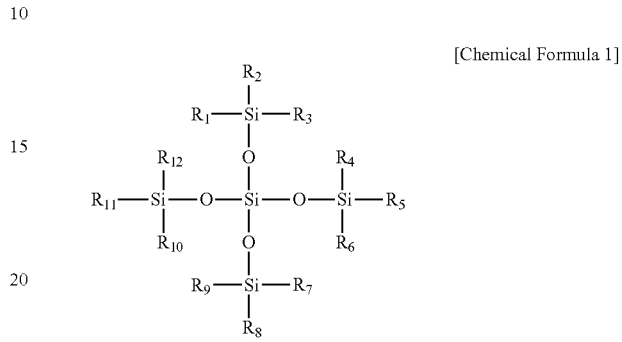

[Chemical Formula 1]

wherein $R_1$ to $R_{12}$ are each independently H or $C_1$-$C_5$ alkyl.

11. An organic electronic device, comprising a substrate and an organic electronic device layer formed thereon, wherein an organic layer(s) is encapsulated by the multi-layer encapsulation film of claim 1.

12. The organic electronic device of claim 11, wherein the organic electronic device layer includes a transparent conductive oxide, an organic layer and a metal electrode.

13. The organic electronic device of claim 12, wherein the substrate is
any one flexible polymer substrate selected from the group consisting of polyethylene terephthalate (PET), polyethylene naphthalate (PEN), polyethylene (PE), polyethersulfone (PES), polycarbonate (PC), polyarylate (PAR) and polyimide (PI),
any one metal substrate selected from the group consisting of SUS (steel use stainless), aluminum, steel and copper, or
a glass substrate.

14. The organic electronic device of claim 11, wherein the organic electronic device is an organic light emitting diode, an organic solar cell or an organic thin film transistor.

* * * * *